United States Patent [19]
Castleberry, Jr. et al.

[11] 3,943,491
[45] Mar. 9, 1976

[54] ULTRASONIC DIGITAL RECEIVER

[75] Inventors: John Castleberry, Jr., Cherry Hill; Edward Peter Cecelski; Ralph Helmut Storz, both of Freehold, all of N.J.

[73] Assignee: RCA Corporation, New York, N.Y.

[22] Filed: Oct. 25, 1974

[21] Appl. No.: 518,097

[52] U.S. Cl. .................. 340/171 R; 340/171 PF
[51] Int. Cl.² .................................. H04Q 9/00
[58] Field of Search ...... 340/171 R, 171 A, 171 PF, 340/167 R, 167 A; 328/108, 119

[56]  References Cited
UNITED STATES PATENTS

| | | |
|---|---|---|
| 3,238,503 | 3/1966 | Uitermark .................. 340/171 PF |
| 3,355,709 | 11/1967 | Hanus ...................... 340/171 R |
| 3,465,294 | 9/1969 | Carsello .................... 340/171 R |
| 3,745,530 | 7/1973 | Carman ..................... 340/171 A |
| 3,766,523 | 10/1973 | Brocker ..................... 340/171 PF |

Primary Examiner—Harold I. Pitts
Attorney, Agent, or Firm—E. J. Norton; R. E. Smiley

[57]                  ABSTRACT

A receiver of ultrasonic pulses having a known pulse width and at a known spacing includes a gate which is normally conditioned to accept the ultrasonic pulses. When the first pulse is received, however, the gate is opened thereafter only when subsequent pulses should be present and is closed when no pulses are expected. Such an arrangement prevents multipath signals being interpreted by the receiver as information.

5 Claims, 6 Drawing Figures (A) 200 ms OSC.
(B) 12 ms OSC.
(C) 3 ms O.S.
(D) COUNTER
(E) OSC. SWITCH
(F) SPEAKER

ULTRASONIC DIGITAL RECEIVER

BACKGROUND OF THE INVENTION

Ultrasonic remote control systems are utilized in a variety of applications including remote control of television sets and remote control of underwater devices. It is common in television set remote control systems to utilize a remote transmitter which emits a different frequency for each function to be remotely controlled in the television set. The television set remote control receiving device has a number of frequency selective input circuits corresponding to the number of different frequencies. As a practical matter, the number of frequencies and, therefore, the number of functions which can be performed is limited to about a dozen whereas it may be desirable to remotely control many more functions.

A digital ultrasonic system is known for controlling underwater apparatus as described in U.S. Pat. No. 3,745,530, issued July 10, 1973, to Richard Jan Carman. In such a digital system, the transmitter transmits serially a series of pulses of one or another frequency. The underwater device may also be suitable where air is the transmission medium for the ultrasonic pressure wave. However, as recognized in that patent, a so-called "multipath" problem exists in either medium. Thus, after a data signal is transmitted, it may bounce off various objects and finally arrive at the receiver long after the data signal arrives via a direct path thus confusing the receiving equipment. The solution set forth in U.S. Pat. No. 3,745,530 is to add a filler pulse at a third frequency between adjacent data pulses to allow the multipath signal to die out before the next data pulse is transmitted. The additional filler pulses may require additional, and therefore costly circuitry to generate at the transmitter and to filter out at the receiver and may themselves create multipath problems.

SUMMARY OF THE INVENTION

An ultrasonic receiver is receptive of an applied pressure wave in the form of spaced-apart signal bursts of predetermined duration and separation, each burst being of one of two frequencies. The receiver includes an input transducer means producing an electrical signal corresponding to the pressure wave and a normally conductive gate means coupled to the transducer means for passing the electrical signal. The gate means has a control terminal responsive to a blocking signal for blocking passage of the electrical signal. The receiver additionally includes a means responsive to at least a minimum duration of a burst of at least one of the two frequencies for producing the blocking signal during the space between bursts and for producing a digital pulse corresponding to the presence of each pulse of at least one of the two frequencies.

DETAILED DESCRIPTION

Figure 1:
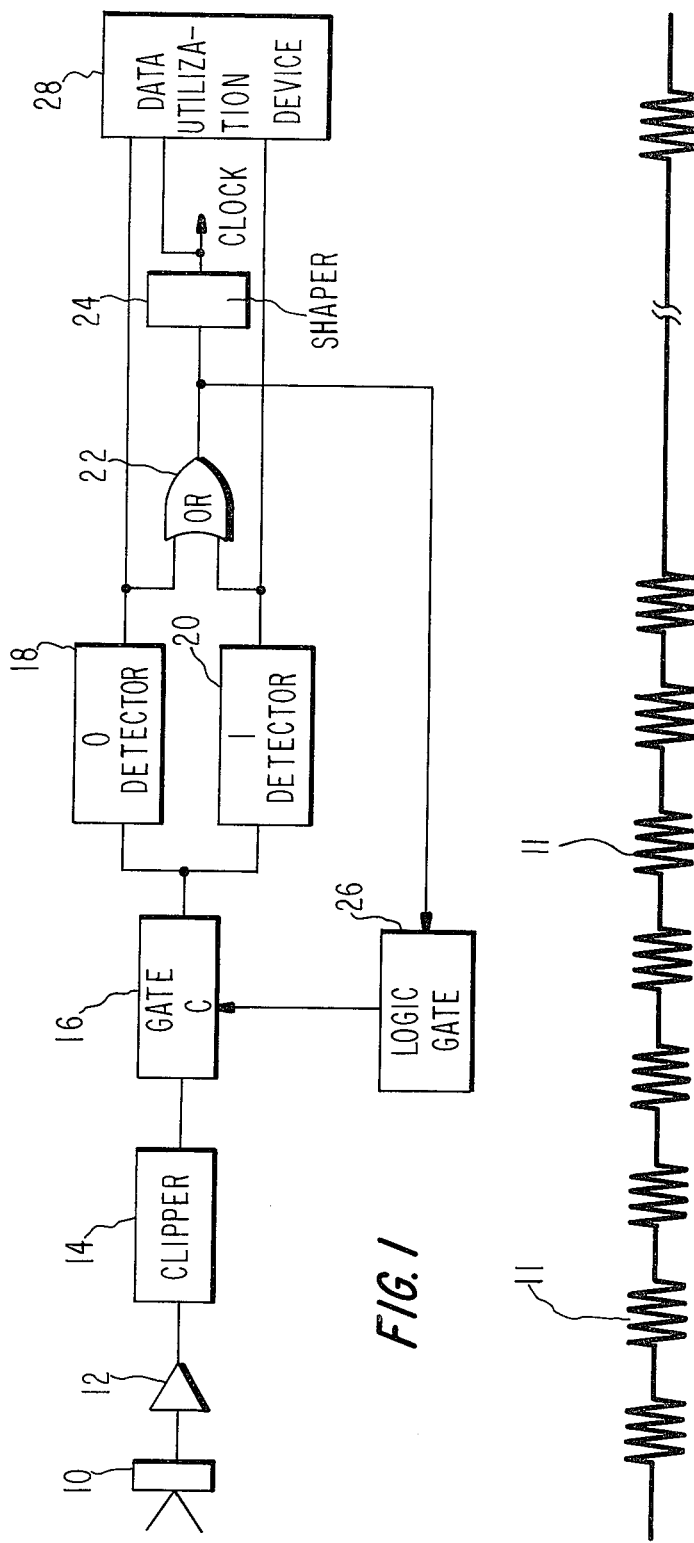
FIG. 1 is a block diagram of a preferred embodiment of the present invention.

Referring now to FIG. 1, a transducer 10 is adapted to receive ultrasonic acoustic signals in the form of spaced apart bursts of one or another frequency, the spacing between bursts being a third frequency, which, in a preferred embodiment, is zero. Such signals are produced by a transmitting device to be described shortly.

Figure 2:
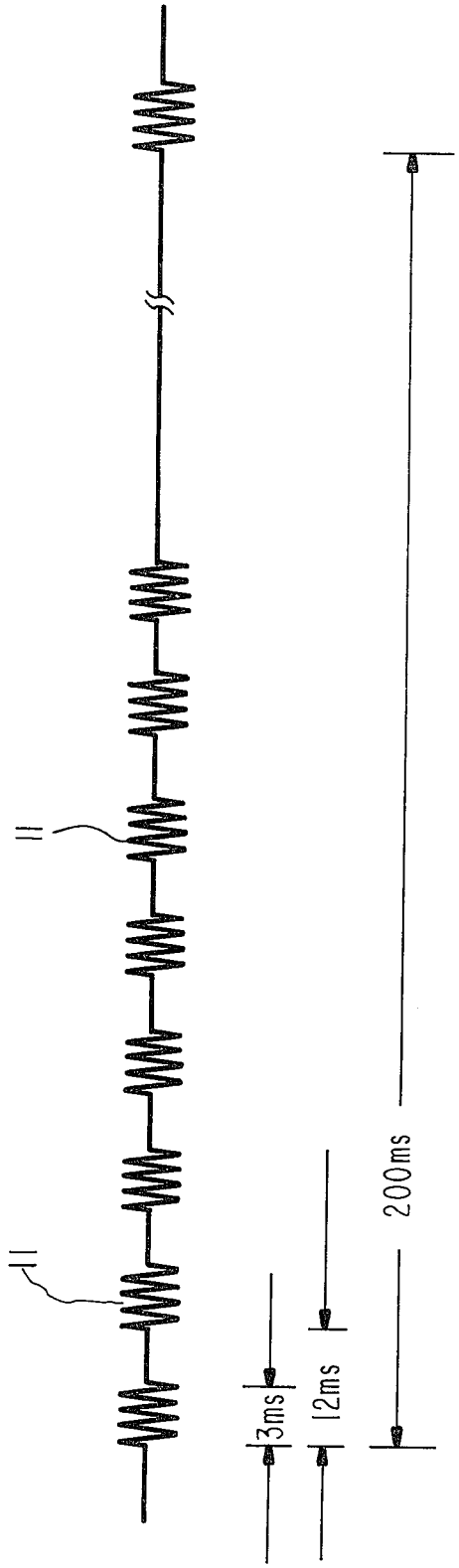
FIG. 2 is a waveform useful in understanding the embodiment of FIG. 1.

The incoming signal to transducer 10 is illustrated in FIG. 2. It comprises a plurality of spaced apart bursts of a sine wave signal 11, eight being shown. The bursts are at a uniform spacing and are of uniform width, each burst being of one or another frequency. In a preferred embodiment, the bursts are at a 12 millisecond (ms) spacing and are each 3 ms in duration. The spacing between successive series of bursts is 200 ms. Each burst is comprised of 46.5 kilohertz (KHz) sine waves representing a binary 0 or 39.2 KHz representing a binary 1. The region between bursts is, in a preferred embodiment, at zero frequency, but may, under some circumstances, be some third frequency.

Returning to FIG. 1, the electrical signal produced by transducer 10 is amplified by amplifier 12 and clipped by clipper 14 to eliminate any amplitude modulation. The output terminal of clipper 14 is coupled to a gate 16. Incoming signals to gate 16 pass through the gate under control of a signal applied to the control (C) terminal of gate 16, the polarity of the control signal being determinative of whether or not a signal applied to the gate passes through the gate. Gate 16 is normally enabled.

The output terminal of gate 16 is coupled to the input terminal of a 0 detector 18, and a 1 detector 20, respectively. The detectors are circuit devices which are responsive to a signal of a specific frequency having a duration greater than a specified minimum time for producing a digital pulse so long as the specific frequency is present at transducer 10. As mentioned in connection with the waveform of FIG. 2, the 0 detector 18 is set to detect a 46.5 KHz signal, while the 1 detector is set to detect a 39.2 KHz signal. Signetics Model 567 demodulators may be utilized for the 0 and 1 detectors, capacitor-resistor combinations being added to the demodulators to make them respond to a given frequency. The minimum number of cycles of a given frequency required to be received by a demodulator before it produces an output is also determined by the addition of circuit components to the demodulator. In the preferred embodiment, each demodulator is set to require approximately 30 cycles of the frequency to which it is tuned before producing an output signal. When the 0 detector 18 or the 1 detector 20 detects approximately 30 cycles of its selected frequency, the resulting signal passes through OR gate 22 to which the output terminals of each of the detectors is coupled. The output terminal of OR gate 22 is coupled to shaper 24 and to gate logic 26 to be described shortly. The output terminal of gate logic 26 is coupled to the C terminal of gate 16. Shaper 24 shapes the signals received from OR gate 22 to produce digital clock pulses of desired magnitude and duration. The output terminal of shaper 24 (clock), as well as the output terminals of detectors 18 and 20, are coupled to a data utilization device (DUD) 28.

DUD 28 need be coupled to only one of the two detectors 18, 20, which when combined with the clock pulses, produces digitally the signal stream received by transducer 10. Thus, for example, if only the 0 detector 18 is coupled to DUD 28, then when a clock pulse is received by DUD 20, the signal being received from the 0 detector will be either a logic 0 or a 1 depending on whether the 0 detector 18 is producing a pulse. Naturally, the same principle applies if only the 1 detector is coupled to DUD 28. The digital signals may be processed within DUD 28 to produce any desired result. With eight pulses in a pulse or burst series of the waveform in FIG. 2, 256 ($2^8 = 256$) unique commands may be generated. However, for practical reasons, it is desirable not to use all 0 burst or all 1 burst information.

A typical example of a DUD 28 is a remotely controlled television set wherein the various combinations of pulses could direct the set to advance or diminish sound volume, to move to a given channel, to change tint, hue, etcetera.

Figure 3:
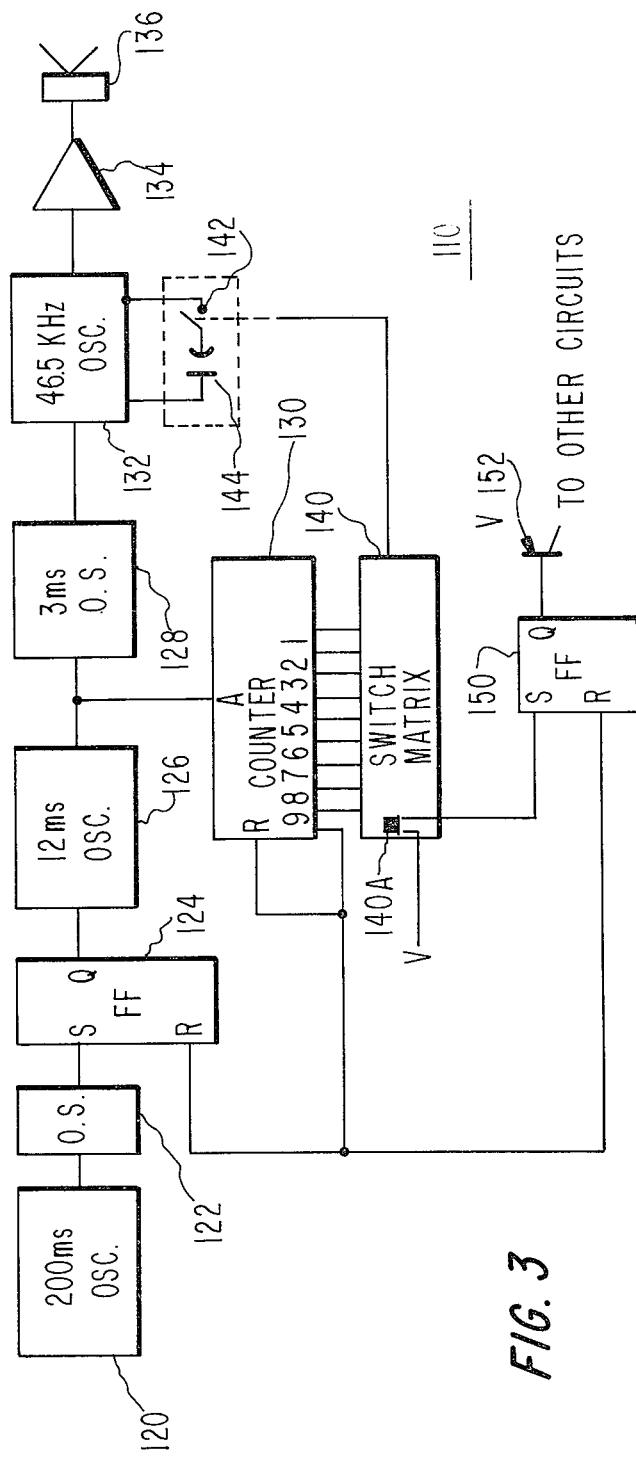
FIG. 3 is a transmitter of the type which produces the waveform of FIG. 2.
Figure 4:
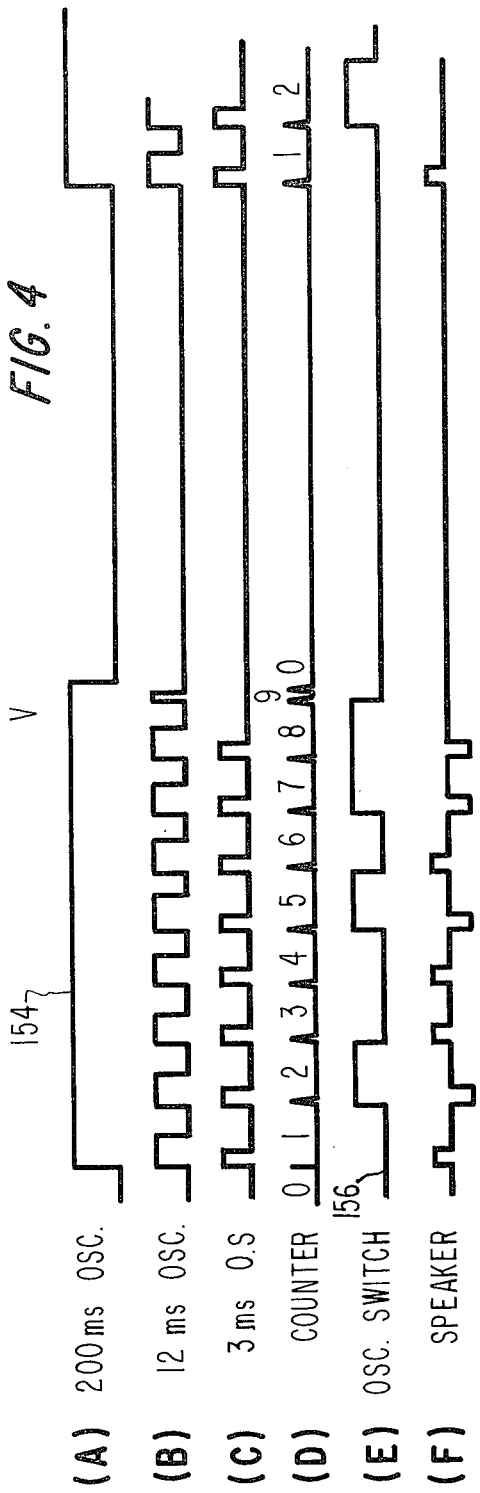
FIG. 4 is a set of waveforms useful in understanding the transmitter of FIG. 3.

The waveform of FIG. 2 is produced by a transmitter 110 of FIG. 3 to which reference should now be made. A 200-ms oscillator 120 is adapted to produce the signal illustrated in FIG. 4 waveform A (hereinafter FIG. 4A) whenever power is applied to it. The 200-ms determines the spacing between groups of pulses or bursts as illustrated in FIG. 2. The output terminal of oscillator 120 is coupled to a one-shot 122. The leading positive edge of the signal from oscillator 120 triggers one-shot 122 to produce a momentary pulse. The output terminal of one-shot 122 is coupled to the set (S) input of flip-flop 124. Flip-flop 124 is set by the pulse from one-shot 122. The Q output terminal of flip-flop 124 is coupled to 12-ms oscillator 126, which produces the waveform illustrated in FIG. 4B, so long as flip-flop 124 is set. The timing of oscillator 126 determines the pulse repetition rate of the FIG. 2 waveform.

The output terminal of oscillator 126 is coupled to a 3-ms one-shot 128, and to the advance (A) terminal of a counter 130. One-shot 128 responds to each positive going portion of the waveform from oscillator 126 to produce a 3-ms pulse which determines the width of the bursts in the waveform of FIG. 2. Counter 130 advances by one each time a positive going pulse is received at the A terminal. The output terminal of 3 ms one-shot 128 is coupled to the input terminal of a 46.5 KHz oscillator 132. The output terminal of oscillator 132 is coupled via a power amplifier 134 to an acoustic transducer 136.

Counter 130 has a plurality of output terminals corresponding to each count of the counter, respective outputs being labelled 0, 1, 2, 3, . . . 9. The terminals 0 through 8 are connected to a switch matrix 140. Switch matrix 140 may, for example, comprise a plurality of two-position switches, each connected to a different one of counter 130 terminals. The various outputs of the switches may be coupled to control the operation of "switch" 142. Switch 142, which in a practical embodiment would most likely be a transistor, when closed, couples a capacitor 144 into the circuit of oscillator 132 to alter its frequency of oscillation. By properly choosing capacitor 144, oscillator 132 may be altered to produce a frequency of 39.2 KHz, the frequency representing a binary 1. FIG. 4E illustrates the setting of switch 142 (positive pulse = switch closed, negative pulse = switch open) when it is desired to transmit the binary pattern 01001011, an arbitrary pattern chosen for illustrative purposes only. FIG. 4E illustrates the output of transducer 136, a positive pulse representing a burst of sine waves at 46.5 KHz (binary 0), a negative pulse representing a burst at a frequency of 39.2 KHz (binary 1).

Switch matrix 140 contains an additional switch 140A, which is closed when it is desired to transmit a message. Voltage V from a source of potential (not shown) is coupled through switch 140A to set flip-flop 150 at its S terminal. Flip-flop 150 has bias voltage V applied to it at all times. When flip-flop 150 is set, it activates transistor 152, which in turn applies voltage V to all the other circuits illustrated in FIG. 3 including oscillator 120, which, upon energization, produces the positive going pulse 154, FIG. 4A. The 9th position of counter 130 is coupled to the reset (R) terminal of flip-flop 124, the R terminal of flip-flop 150, and the (R) terminal of counter 130. Operation of FIG. 3 is as follows: The various switches of switch matrix 140 are set to produce the desired binary pattern. Then switch 140A is momentarily closed. (Alternately a number of the switches of switch matrix 140 may be push-button switches and each may include an additional contact coupled between source of potential V and the S terminal of flip-flop 150. Flip-flop 150 becomes set closing switch 152 which causes power to be supplied to oscillator 120 and to all the other circuits. The leading edge of the positive going portion of the waveform from oscillator 120 triggers one-shot 122, which in turn, produces a momentary pulse to set flip-flop 124. The resulting signal at the Q terminal of flip-flop 124 activates oscillator 126, which produces 6-ms positive going pulses every 12-ms. The leading edge of the first pulse advances counter 130 from a count of 0 to a count of 1 and triggers one-shot 128, which produces a 3-ms pulse. The 3-ms pulse activates the 46.5 KHz oscillator 132, which produces an acoustic wave at transducer 136 for 3-ms. As illustrated in FIG. 4E, at reference numeral 156, switch 142 is open so there is no modification of the frequency of oscillator 132.

At the termination of the 3-ms signal from one-shot 128, oscillator 132 ceases its output until the next one-shot output pulse is produced 9-ms later. This 9-ms "dead" time permits any multi-path signal present in the environment in which the transmitter and receiver are located to die out before the next ultrasonic burst is transmitted.

The next positive going pulse from oscillator 126 advances the counter to a count of 2 and also triggers one-shot 128. As illustrated in FIG. 4E, switch 142 is closed when the counter is at a count of 2 so that transducer 126 will be at the 39.2 KHz, which represents a binary 1. As subsequent positive pulses are produced by oscillator 126, the counter will continue to advance and the signal from one-shot 128 will cause oscillator 132 to produce a signal at the relatively higher or relatively lower frequency depending on the setting of switch 142. The pulses just described continue until eight pulses have been generated by oscillator 126 and one-shot 128. The leading edge of the 9th pulse from oscillator 126 advances counter 130 to a count of 9. The 9th count causes the immediate resetting of flip-flop 124 and of counter 130. When flip-flop 124 is reset, the pulse from the oscillator immediately ceases before one-shot 128 is again triggered. Therefore, oscillator 132 is not triggered a ninth time.

If, when the count of 9 occurs, switch 140A is still depressed, the resulting input pulse to the S terminal of flip-flop 150 takes precedence over the pulse to the R terminal so that flip-flop 150 stays set supplying power to the various other circuits of transmitter 110, including power to oscillator 120. In such a case, the eight pulses will be produced again, beginning 200-ms after the first of the preceeding set of pulses. This may be particularly desirable, if, for example, it is desired to lower the volume of a TV set. It will be lowered incrementally each time eight pulses are received. Whenever a count of 9 occurs in counter 130 and push-button 140A is not depressed, flip-flop 150 will be reset removing power from all circuits and terminating the transmission of further ultrasonic waves until switch 140 is again depressed. The timing of the 200-ms oscillator is somewhat arbitrary. The dead time between the eighth pulse and the first pulse of the next group must be sufficiently long to allow multipath signals from the eighth pulse to die down. But this could occur in approximately 9-ms or less (the dead time between each of the other pulses). The dead time should be somewhat longer than 9-ms since, as will be described, the presence of the first pulse of the eight must be accurately established. Also, the time must be sufficiently long to permit DUD 28 (FIG. 1) to act upon the 8 bits it has already received.

Figure 5:
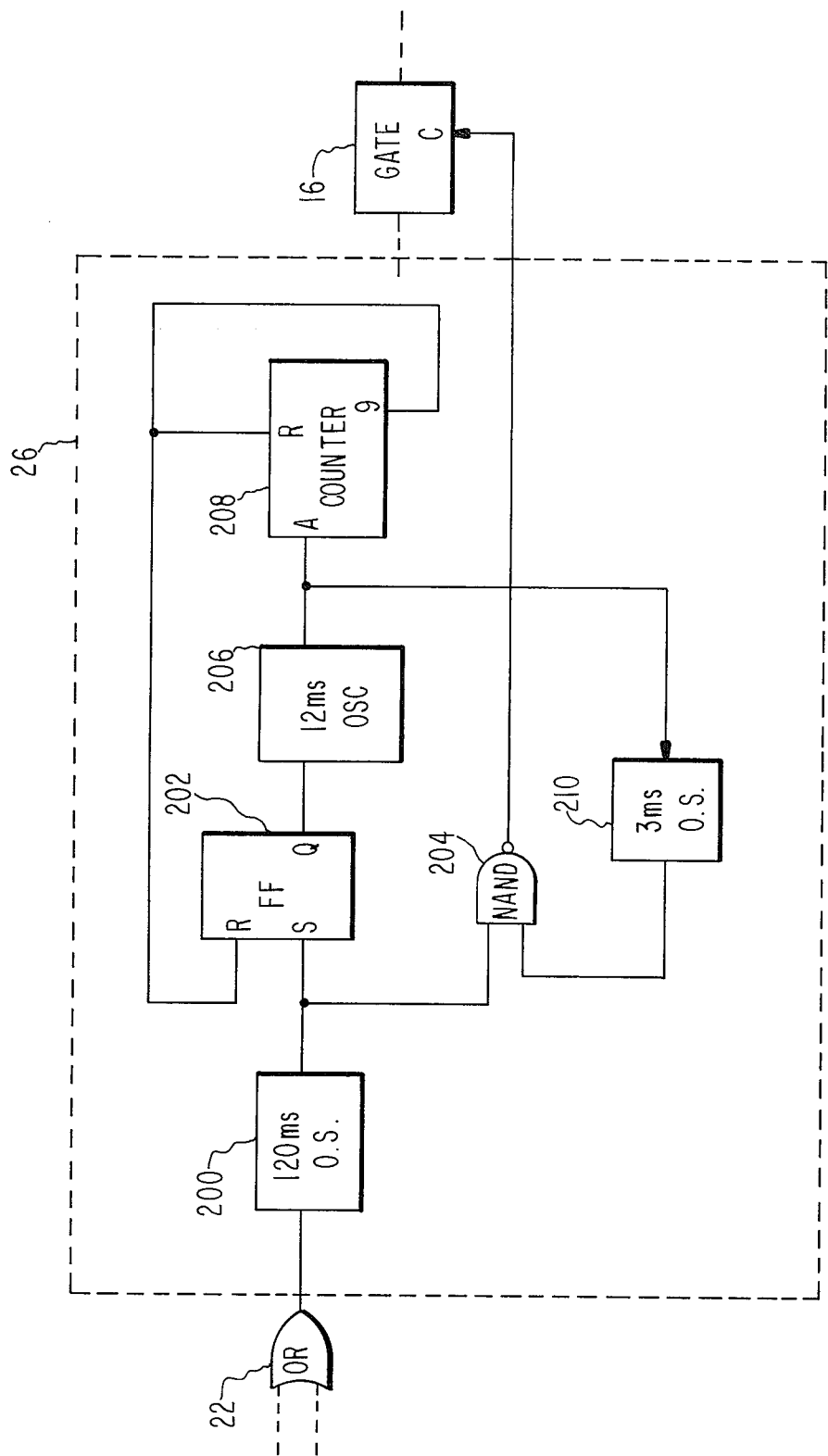
FIG. 5 is one form of logic gate useful in the embodiment of FIG. 1.

In FIG. 5, one version of the Gate Logic 26 is illustrated. OR gate 22 (previously shown in FIG. 1) is coupled to 120-ms one-shot 200 of gate logic 26. The output terminal of one-shot 200 is coupled to the S (set) terminal of flip-flop 202 and one of the inputs to a NAND gate 204. The output terminal of flip-flop 202 is coupled to a 12-ms oscillator 206. The output terminal of the 12-ms oscillator 206 is coupled to the A (advance) terminal of counter 208, and to a 3-ms one-shot 210. The 12-ms and 3-ms periods are chosen to correspond to the periods of circuits 120 and 128, respectively (illustrated in FIG. 3).

The output terminal of one-shot 210 is coupled to the second input terminal of NAND gate 204. The output of the NAND gate 204 is coupled to the C (control) input of gate 16 (from FIG. 1). The count of 9 output from counter 208 is coupled to the R (reset) terminal of flip-flop 202 and the R (reset) terminal of itself (counter 208).

In operation, when the first pulse is received at either the 0 or 1 detectors, 18 and 20 respectively, the output state of OR gate 22 changes and the 120-ms one-shot 200 is triggered. The 120-ms period is somewhat arbitrary. It need only be greater than 96-ms (8 pulses × 12-ms/pulse = 96-ms) and shorter than the period between transmitted words — 200-ms as determined by oscillator 110 (shown in FIG. 3).

The leading edge of the pulse from one-shot 200 sets flip-flop 202 (actually a one-shot or differentiator may be interposed between one-shot 200 and the flip-flop so that only a momentary pulse is applied to set the flip-flop). The 120-ms pulse from one-shot 200 acts as an enabling signal to NAND gate 204. When flip-flop 202 is set, oscillator 206 immediately begins to produce a square wave signal having a period of 12-ms (illustrated in FIG. 4B). The leading edge of this signal triggers one-shot 210 to produce a 3-ms pulse which is fed to the second input of the NAND gate 204. With the 120-ms gate 200 signal applied to one input of the NAND gate 204, and 3-ms signal from one-shot 210 controls the level at the output of NAND gate 204 and causes gate 16 to pass the incoming signal during the period when the 3-ms pulse is present. Actually, the time between the triggering of one-shot 200, which enables NAND gate 204 and the triggering of O.S. 210, which supplies the second input for NAND gate 204 is negligable. Therefore, the pulse produced by one-shot 210 enables gate 16 to let the first pulse received from transmitter 110 through the 0 or 1 detector and into the DUD 208.

When the period of one-shot 210 ends, gate 16 is disabled during the time that multipath signals from transmitter 110 are in the environment and, therefore, present at the input of the 0 and 1 detectors. It should be noted that the leading edge of the gate enabling pulse from 12-ms oscillator 206 and 3-ms one-shot 210 do not coincide with the leading edge of the 3-ms signal received from transmitter 110, but rather are delayed by the amount of the delay in the 0 or 1 detector. For a delay of 30 cycles, as in the preferred embodiment, the delay amounts to about 0.7-ms. That is, for the second through the eighth ultrasonic pulses, gate 16 is enabled about 0.7-ms after each pulse is received at transducer 10 (FIG. 1).

There is a further delay of 0.7-ms for each pulse reaching DUD 28 (FIG. 1) due to the delay in the 0 and 1 detectors 18, 20. Thus, from the time a given ultrasonic pulse reaches transducer 10 until that pulse has reached DUD 28, 1.4-ms has elapsed. This is, of course, less than the 3-ms pulse width so the system still operates satisfactorily. Nevertheless, since it is not possible to make the two 12-ms oscillators (126, FIG. 3, and 206, FIG. 5) operate in synchronism, it is desirable to have oscillator 206 operate at a slightly higher frequency such as, for example, at a rate such that the period is 11.9-ms. Thus, gate 16 will be enabled earlier for each succeeding pulse but not earlier than ultrasonic pulses are expected at gate 16. Subsequent pulses from oscillator 206 advance the counter 208 by one and trigger one-shot 210 to let the second through the eighth pulses through gate 16 while preventing intermediate multipath signals from getting through the gate. When counter 208 steps to a count of 9, a pulse is generated to reset flip-flop 202 and to reset counter 208. As described in connection with the transmitter 210, the reset action occurs so fast that one-shot 210 does not trigger a ninth time.

At the time the ninth pulse occurs, the blocking pulse from one-shot 200 is still present at OR gate 204. Therefore, gate 16 is disabled until all multipath signals from transmitter 110 die down. Then, the pulse from one-shot 200 terminates, and the receiver of FIG. 1 is again conditioned to accept ultrasonic pulses. The gate logic circuit of FIG. 5 provides satisfactory operation so long as 12-ms oscillator 206 is reasonably synchronized with 12-ms oscillator 126 (FIG. 3) so that gate 16 opens when pulses from transmitter 110 are present. If such synchronism is not economically feasible, then the alternate logic of FIG. 6 is preferable.

Figure 6:
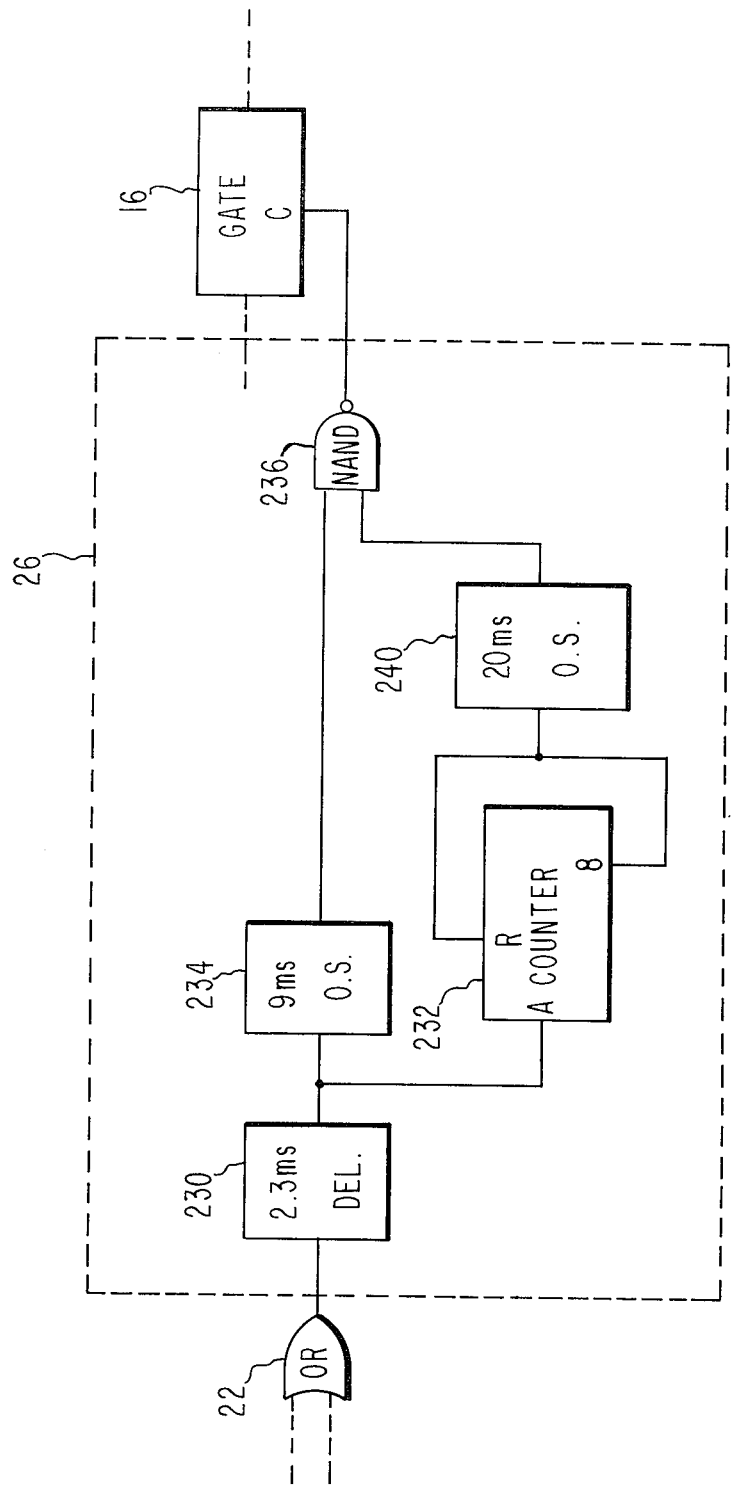
FIG. 6 is an alternate form of logic gate useful in the embodiment of FIG. 1.

Referring to FIG. 6, where OR gate 22 and gate 16 from FIG. 1 are again reproduced, the output terminal of OR gate 22 is coupled to a 2.3-ms delay 230 of logic gate 26. The output terminal of delay 230 is coupled to the A terminal of counter 232, and to one-shot 234. The output terminal of one-shot 234 is coupled to one input terminal of NAND gate 236. The output terminal for the eighth step of counter 232 is coupled to the reset terminal of counter 232, and to the input terminal of a 20-ms one-shot 240, the output terminal of which is coupled to the second input terminal of NAND gate 236. The output terminal of NAND gate 236 is coupled to the C terminal of gate 16.

In the operation of the circuit of FIG. 6, the initial conditions are such that gate 16 is enabled. Therefore, when the first ultrasonic pulse is received by the 0 and 1 detector 18 or 20, respectively, of FIG. 1, the resulting pulse 0.7-ms (30 cycles) later from one of the detectors appearing at OR gate 22 triggers 2.3-ms delay 230. At the termination of the 2.3-ms delay when the receiver of FIG. 1 is no longer receiving a pulse, 9-ms one-shot 234 is triggered, resulting in a disabling pulse at NAND gate 236, which, in turn, disables gate 16 for 9-ms. The gate 16 is disabled for 9-ms to allow any multipath signal from transmitter 110 to die down before the gate is again enabled. The pulse which triggered one-shot 234 also advanced counter 232 to a count of 1.

The second pulse received at OR gate 22 again triggers delay 230, which in turn, 2.3-ms later, advances counter 232 to a count of 2 and triggers one-shot 234 to disable gate 16 for 9-ms. This process repeats until a count of 8 is reached in counter 232. Then the counter is reset and one-shot 240 is triggered, providing a disabling pulse via NAND gate 236 to disable gate logic 16. The time of 20-ms is rather arbitrary. It should be sufficiently long to prevent unwanted signals from triggering the receiver, but sufficiently short, so as not to disable the receiver from receiving the first and subsequent pulses from the next group of pulses from transmitter 110 if pushbutton 140A is held depressed.

It should thus be appreciated that with the gate logic just described, each pulse received by the receiver of FIG. 1 individually triggers the blockage of gate 16. By way of contrast in the gate logic of FIG. 5, the first received pulse controls the blockage of gate 16 during the time of all of the eight received pulses.

Having described the operation of the ultrasonic transmitter 110 and of the two alternate forms of the gate logic 26, the operation of the system will now be described. Switch 140A on transmitter 110, FIG. 3, is depressed causing the transmitter to emit, for example, a series of eight 3-ms bursts with a period of 12-ms. Some of these bursts will be at a frequency of 46.5 KHz representing binary 0's and some will be at a frequency of 39.2 KHz representing binary 1's. Referring to FIG. 1, the first pulse to reach transducer 10 will (after being amplified and clipped) be gated through gate 16, which is normally enabled. One or the other of detectors 18 and 20 will be responsive to a number of cycles (about 30 cycles or approximately 0.7-ms) of the frequency to which it is tuned to determine that either a 0 or 1 pulse is being received and will produce a pulse lasting until the signal ceases to be received at transducer 10 (about 2.3-ms) or stopped from being detected by the gating circuit. The leading edge of the pulse from the activated detector passes through OR gate 22 producing a pulse to operate logic gate 26 as previously described in connection with FIGS. 5 and 6, and produces a momentary CLOCK pulse from shaper 24. The CLOCK pulse enables DUD 28 to receive a 1 or 0 depending on which detector is producing the pulse. When gate 16 is no longer receiving an ultrasonic burst or when the anticipated end of the pulse has come, gate logic 26 disables gate 16 until the next ultrasonic burst is due. Thus, multipath signals present in the atmosphere do not produce unwanted pulses within the receiver to trigger DUD 28. After eight pulses are received by DUD 28, gate 16 is disabled for a considerable period allowing all multipath signals to completely dissipate and allowing DUD 28 sufficient time to act on the binary command it has received.

It should be appreciated that the various parameters given in the description are for illustration only. Thus, the number of ultrasonic pulses, their frequency, duration, repetition rate, etc., will be adapted to suit the particular environment in which the system is placed.

What is claimed is:

1. Apparatus for receiving and decoding an applied signal wave having a plurality of spaced apart tones, each of one or another frequency, the spacing between successive tones being of predetermined duration, the length of each tone being of predetermined minimum duration, comprising in combination:
    input transducer means producing an electrical signal corresponding to said signal wave;
    normally conductive gate means coupled to said transducer means for normally passing said electrical signal representing each of said tones, said gate means having a control terminal responsive to a control signal for blocking passage of said electrical signal; and
    means responsive to the signal from said gate means of a duration corresponding to a tone of at least said minimum duration for producing said control signal to block signal passage through said gate for a duration equal to the spacing between successive tones, and for also producing a digital pulse representing each tone of said one or another frequency.

2. The combination as set forth in claim 1, wherein said means responsive to the signal from said gate means comprises a first demodulator means responsive to said electrical signal received from said gate means corresponding to said one frequency for producing a digital pulse only after said electrical signal corresponding to said one frequency has been present for at least said minimum duration and a similar demodulator responsive to said signal corresponding to said another frequency for producing a different digital pulse, and comprising means responsive to either pulse for generating said control signal for blocking said gate means.

3. The combination as set forth in claim 1, wherein said means responsive to the signal from said gate means comprises a demodulator means responsive to said electrical signal received from said gate means corresponding to a first one of said one and another frequencies for producing a digital pulse only after said electrical signal corresponding to said first one of said frequencies has been present for at least said minimum duration, and comprising means including counter means responsive to said pulse for generating control signals to block said gate means between the times each of said known plurality of tones is received.

4. Apparatus for receiving and decoding an applied pressure wave having a predetermined plurality of spaced apart tones, each of one or another frequency, the spacing between successive tones being of predetermined duration, the length of each tone being of predetermined minimum duration, comprising in combination:
    input transducer means producing an electrical signal corresponding to said pressure wave, having one value when said one frequency is received and having another value when said another frequency is received;

normally conductive gate means coupled to said transducer means for normally passing said electrical signal representing each of said tones, said gate means having a control terminal responsive to a control signal for blocking passage of said electrical signal; and means responsive to the signal received from said gate means of at least said minimum duration of one of said values for producing control signals to block passage through said gate during the intervals between the known number of successive tones, said last-mentioned means also producing a digital signal representing each tone of said one and another frequency.

5. Apparatus for receiving and decoding an applied signal wave having a predetermined plurality of spaced apart tones, each of one or another frequency, the spacing between successive tones being of predetermined duration, and being normally silent but which may contain the frequency of the next earlier transmitted tone, the length of each tone being of predetermined minimum duration, comprising in combination:

input transducer means producing an electrical signal corresponding to said signal wave having one value when said one frequency is received and having another value when said another frequency is received;

normally conductive gate means coupled to said transducer means for normally passing said electrical signal, said gate means having a control terminal responsive to a control signal for blocking passage of said electrical signal;

a first demodulator means coupled to said gate means responsive to each signal of said one value of at least said known duration for producing a pulse, a second demodulator means similar to said first demodulator means also coupled to said gate means and responsive to each signal of said another value for producing a different pulse, means including counter means responsive to the first pulse received from either demodulator means for producing said control signal to block said gate means during the intervals between the rest of said known plurality of said tones whereby the demodulators receive no signals. during the normally silent portions of said signal wave.

* * * * *